United States Patent [19]

De Vries

[11] 4,393,358
[45] Jul. 12, 1983

[54] SURFACE WAVE ACOUSTIC DEVICE WITH COMPENSATION FOR DIFFRACTION EFFECTS

[75] Inventor: Adrian J. De Vries, Mount Prospect, Ill.

[73] Assignee: Zenith Radio Corporation, Glenview, Ill.

[21] Appl. No.: 322,331

[22] Filed: Nov. 18, 1981

[51] Int. Cl.³ .................... H03H 9/145; H03H 9/64; H03H 9/42
[52] U.S. Cl. .................... 333/194; 333/151; 333/154; 333/195
[58] Field of Search .................... 333/150–155, 333/193–196; 310/313 R, 313 A, 313 B, 313 C, 313 D; 29/25.35

[56] References Cited

U.S. PATENT DOCUMENTS

| | | | |
|---|---|---|---|
| 3,908,137 | 9/1975 | Hunsinger et al. | 333/152 X |
| 4,004,254 | 1/1977 | De Vries | 333/153 |
| 4,263,569 | 4/1981 | Moellmer | 333/196 X |
| 4,342,011 | 7/1982 | Iwamoto et al. | 333/195 X |
| 4,350,963 | 9/1982 | Iwamoto et al. | 333/194 X |

Primary Examiner—Marvin L. Nussbaum

[57] ABSTRACT

In a surface acoustic wave filter which employs a multistrip coupler to offset the acoustic wave path, diffraction effects lead to spurious responses at a filter trap frequency. The diffracted wavefronts are curved, instead of being straight and parallel to the transducer fingers as are the wavefronts of the strip-coupled acoustic signal. Thus an additional transducer is employed which has fingers slanted at the same angle as the local wavefronts of the diffracted acoustic energy. The resulting parallel relationship permits the additional transducer to be designed so that it compensates for the undesired trap frequency response by producing an equal magnitude, oppositely phased trap frequency output. In order to conserve substrate area, a technique is disclosed for locating the compensating transducer within a dummy area of an apodized main receiving transducer.

12 Claims, 2 Drawing Figures

SURFACE WAVE ACOUSTIC DEVICE WITH COMPENSATION FOR DIFFRACTION EFFECTS

This invention relates to surface acoustic wave devices, such as filters, which have an improved frequency response characteristic.

BACKGROUND AND PRIOR ART

Surface acoustic wave signal channels are often used as filters, for example in the IF sections of commercial television receivers. A typical configuration employs a sending interdigital transducer and a receiving interdigital transducer upon a substrate of piezoelectric material. The primary propagation direction of the sending transducer and the primary reception direction of the receiving transducer are parallel, but are usually offset from each other to avoid bulk mode coupling. A multi-strip coupler is employed to transfer the acoustic signal wave laterally from the propagation path to the reception path.

The transducers are also coupled, however, by a diffracted surface wave, which does not travel along these primary paths and is not transferred in the normal way by the multi-strip coupler. This diffracted wave travels in various directions, including a direct path extending more or less diagonally across the coupler to the receiving transducer. Such direct coupling is undesirable in a filter or any other frequency-selective device, because the frequency response of the receiving transducer to the diffracted wave is different from its frequency response to the primary wave. Neglecting diffraction effects, the theoretically expected response (output voltage as a function of signal frequency) for the primary transducer system comprises a passband and rejection (trap) bands at frequencies both above and below the passband. The effect of the diffracted wave, however, is to increase the response amplitude within the rejection bands. See the article by the present inventor entitled: "Spurious Coupling Between Length-Weighted Transducers Acoustically Connected By Means of a Multistrip Coupler," in Electronics Letters of May 16, 1974, Vol. 10, No. 10, pp. 172-173).

Often at least one of the transducers is apodized (finger-length-weighted) to enhance its frequency selectivity. Some of the fingers in such a transducer are relatively short. Since diffraction effects are more pronounced when shorter transducer fingers are employed, the problem of diffraction coupling is even more serious in devices employing one or more apodized transducers.

It would be desirable to prevent or compensate for diffraction coupling, and thereby obtain a frequency response closer to that which is theoretically predicted for the primary wave alone. One suggestion in the prior art is to deposit a surface acoustic wave barrier of dampening or reflecting material over the multi-strip coupler. This approach is disclosed in the present inventor's U.S. Pat. No. 4,004,254, as well as in the above-cited technical article.

Another solution, disclosed in a co-pending patent application of the present inventor, is to use two separate acoustic channels, each having its own sending transducer and its own receiving transducer, one channel being out of phase with the other and mimicking the other's response to diffracted and other spurious waves.

The effects of diffraction can also be minimized by enlarging the aperture (i.e. breadth) of the surface wave transducers employed, because such enlargement entails longer transducer finger lengths, which are less suscepticle to diffraction effects. But this alternative is quite costly in terms of substrate area when surface wave devices are fabricated upon substrates of monocrystalline YZ cut or 128° cut lithium niobate (LiNbO$_3$). When these substrate materials are used for TV filters, therefore, it is customary to keep the maximum aperture size down to a value of 15$\lambda_o$, where $\lambda_o$ is the center wavelength of the filter passband. In filters with a transducer aperture that size, diffraction effects are significant.

One particular filter design calls for a passband from about 40.5 to 47 MHz, and a trap or null at 47.25 MHz having a depth of at least 55 dB and a 50 dB-width of a few hundred KHz. Due to diffraction effects, however, the trap at that frequency may be only 40 dB deep. Actual measurements have shown that the spurious field intensity at 47.25 MHz is significant, about one-twentieth the field intensity at the center of the passband.

BRIEF SUMMARY OF THE INVENTION

The basic insight underlying this invention is that the diffracted wave fronts are curved and therefore lie at an angle to the fingers of the receiving transducer, whereas those of the desired signal are straight and parallel to the fingers. This provides a unique way of discriminating between the diffracted wave and the desired wave. A compensating transducer is located in the path of the diffracted wave and provided with fingers which are angled so as to be parallel to the diffracted wave fronts. The compensating transducer is also positioned so that is electrical output is in phase opposition to that of the receiving transducer, and the two are connected electrically in parallel so that the output of the compensating transducer tends to compensate for the response of the receiving transducer at the trap frequency.

This invention will now be described in detail, in connection with the following drawings:

DETAILED DESCRIPTION OF THE PREFERRED EMBODIMENTS

Figure 1:
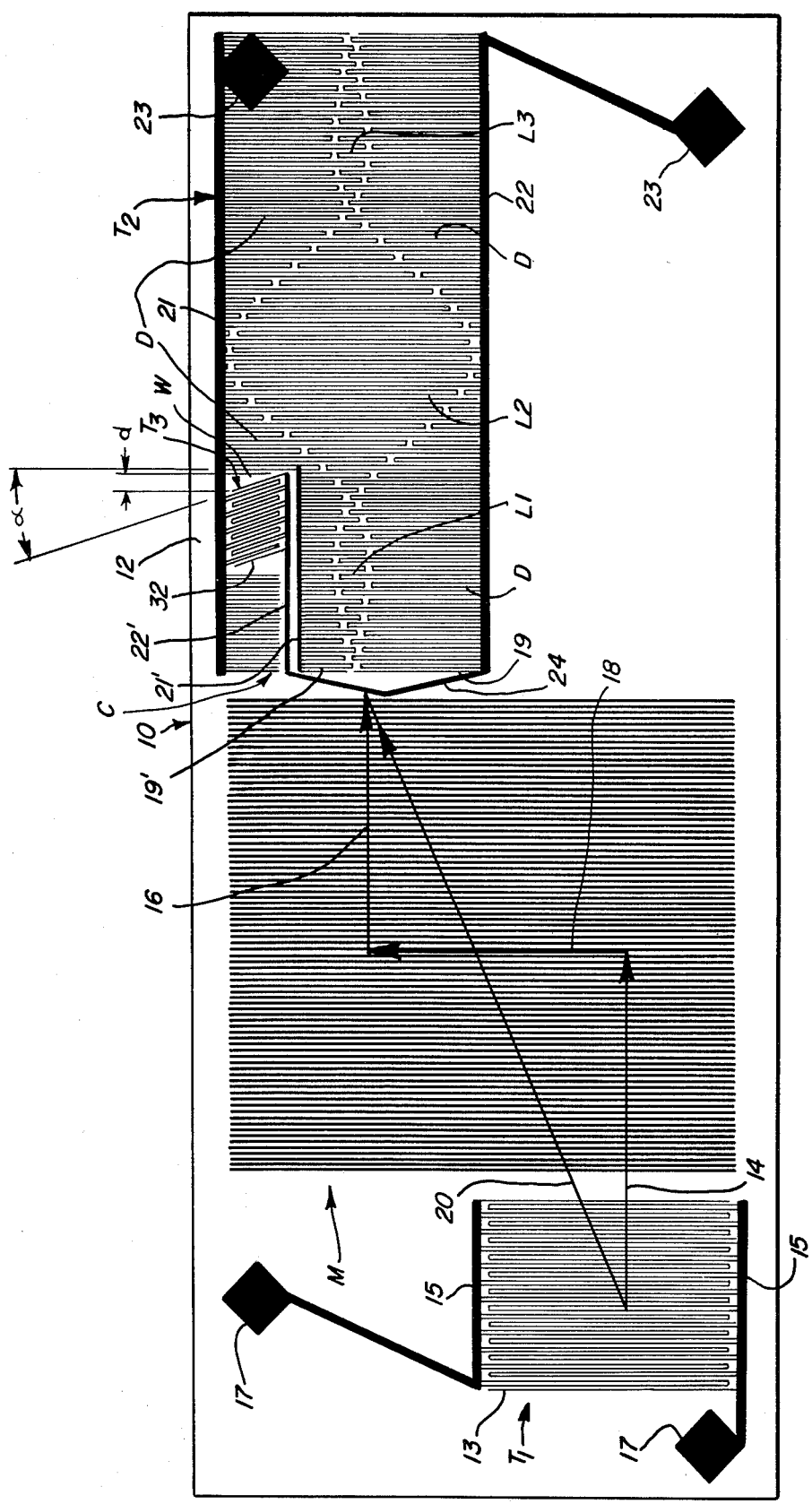
FIG. 1 is a top plan view of a surface acoustic wave filter in accordance with this invention.

The device seen in FIG. 1 is a surface acoustic wave filter 10 which is particularly adapted for use as a bandpass filter in the intermediate frequency section of a commercial television receiver. It comprises a slab 12 of piezoelectric material on the surface of which are printed, in the form of metallic lines, an interdigital sending transducer T1 having finger pairs 13, bus bars 15, and terminals 17, a multi-strip coupler M, and a primary receiving interdigital transducer T2. The receiving transducer has an array of finger pairs 19, primary bus bars 21 and 22, and terminals 23. The finger pairs of at least one of the transducers (in this case finger pairs 19 of transducer T2) are preferably apodized to improve the frequency response characteristics of the transducer system; that is to say the over-lapping regions of the transducer fingers are length-weighted along the axis of the transducer. Both transducers could be apodized, if desired; but often one of them (in this case T1) has uniform fingers in order to conserve substrate area. The transducer fingers 13 and 19 are preferably split, which improves their acoustic reflection properties. As so far described, filter 10 is conventional.

The primary acoustic wave propagation direction of the sending transducer T1 is indicated by an arrow 14, while the primary reception direction of the receiving transducer T2 is indicated by an arrow 16. These paths 14 and 16 are parallel to each other, but the two transducers are laterally offset so that the paths do not coincide. This arrangement prevents bulk mode acoustic energy propagated by the sending transducer T1 from influencing the receiving transducer T2. The multi-strip coupler M receives the primary acoustic wave propagated by the transducer T1 along path 14, and transfers it laterally as shown by arrow 18, so that it can be received by transducer T2 along path 16.

Unfortunately, however, the sending transducer T1 also propagates a diffracted acoustic wave in a multi-lobed pattern extending 360° about the transducer T1. One of the directions of propagation is a path 20 which diagonally traverses the multi-strip coupler M and goes directly toward the receiving transducer T2, where it is received by the latter and therefore influences the electric output of the filter 10. This is disadvantageous, because the frequency response of the apodized transducer T2 to the diffracted wave 20 is substantially different, particularly at the 47.25 MHz trap frequency, from its response to the primary wave propagated along the paths 14 and 16.

Studies done with a scanning electron microscope have shown that at the center frequency of the IF passband (43.5 MHz) the acoustic wave fronts are nearly straight, and essentially perpendicular to the propagation direction indicated by arrows 14 and 16; but at the 47.25 MHz trap frequency the acoustic wave fronts are curved. These field configurations have also been confirmed by theoretical calculations. The straight wavefronts are parallel to the fingers of the apodized transducer T2, and therefore interact with the latter in a straight-forward and well understood way: i.e. the finger-spacing and the apodization of the transducer are the principal factors determining its response at 43.5 MHz. But the curved wavefronts impinge on the fingers 19 of T2 at various angles which range in value up to about 30°, causing these wavefronts to interact with T2 in a different and not easily predictable way. Thus a filter, the finger-spacing and apodization of which are designed for a theoretical null at 47.25 MHz, in practice proves to have a significant spurious response at that frequency.

The approach of this invention is to add to the filter a secondary receiving transducer T3 which has an array of pairs of (preferably split) fingers 32, all of which are disposed at an angle $\alpha$ to the finger pairs 19 of the primary receiving transducer T2. The angle $\alpha$ is chosen to equal whatever value is assumed by the diffracted wavefront angle in the vicinity of the secondary receiving transducer T3. As a result, the finger pairs 32 of T3 are substantially parallel to the diffracted wavefronts and thus interact with them in the well understood way. This permits the finger spacing and other characteristics of secondary transducer T3 to be designed for a predictable response at the trap frequency (e.g. 47.25 MHz). The electrical output of T3 in response to this spurious frequency can thus be designed to equal that of the primary transducer T2 at that frequency, and to be in phase opposition thereto. Compensation for T2's trap frequency response is then achieved by electrically connecting T2 and T3 in such manner that their respective outputs in response to trap frequency interference cancel each other. This connection can be either series or parallel, but a parallel connection (as illustrated in drawings) is preferred because it avoids impedance-matching problems.

Theoretically, the secondary transducer T3 can be located anywhere on substrate 12 where the diffracted wave will impinge upon it (provided the finger angle $\alpha$ is chosen equal to whatever value is assumed by the diffracted wavefronts at the chosen location). The present patent application is intended to cover any such choice of location. But in the preferred embodiment of the invention illustrated, the secondary transducer T3 is located in one of the inactive (dummy) areas D of the apodized primary transducer T2. Apodization restricts the active areas (the areas of interdigitation of finger pairs 19) to a plurality of centrally located holes such as L1, L2 and L3. The remaining dummy areas D are those located on either side of the central lobes, i.e. between the lobes and the two bus bars 21 and 22. These areas are inactive because the opposed fingers 19 are not interdigitated there. Therefore other structures (such as a terminal 23 and the secondary transducer T3) can be located within areas D, in order to save expensive substrate area, without interfering with the operation of primary transducer T2.

In order to locate the secondary transducer T3 in an inactive area D, a portion thereof, which may be described as a window area W, is left clear of fingers 19, and T3 is placed at that location. This, however, results in disconnecting a group of active fingers 19' from the primary bus bar 21, to which they must be electrically connected. Therefore an auxiliary bus bar 21' is located between window area W and the active lobes L1, etc. Auxiliary bus bar 21' is electrically connected at one of its extremities to at least one of the fingers 19, beyond the window area W, which remains connected to primary bus bar 21. Bus bar 21' is also electrically connected to the otherwise disconnected fingers 19'.

In order to connect secondary transducer T3 electrically in parallel with primary transducer T2, one split finger 32 of each finger pair is connected to the same primary bus bar 21 which comprises one half of the output circuit of primary transducer T2. The other split finger 32 of each finger pair is connected to another auxiliary bus bar 22', which is located between secondary transducer T3 and the first auxiliary bus bar 21'. The second auxiliary bus bar 22' in turn is connected by a printed circuit lead line 24, running externally of transducer T2, to the other primary bus bar 22. Auxiliary bus bar 22' is spaced, and therefore electrically isolated, from auxiliary bus bar 21' and from those fingers 19 and 19' which are connected to bus bars 21 and 21' respectively. In the portion of window area W which is not occupied by the secondary transducer T3, the disconnected continuations C of fingers 19' are allowed to remain, in order not to change significantly the average extent of surface metallization in that area. The extent of metallization affects the local surface acoustic velocity, and a local change causes distortion of the surface acoustic wave field.

Figure 2:
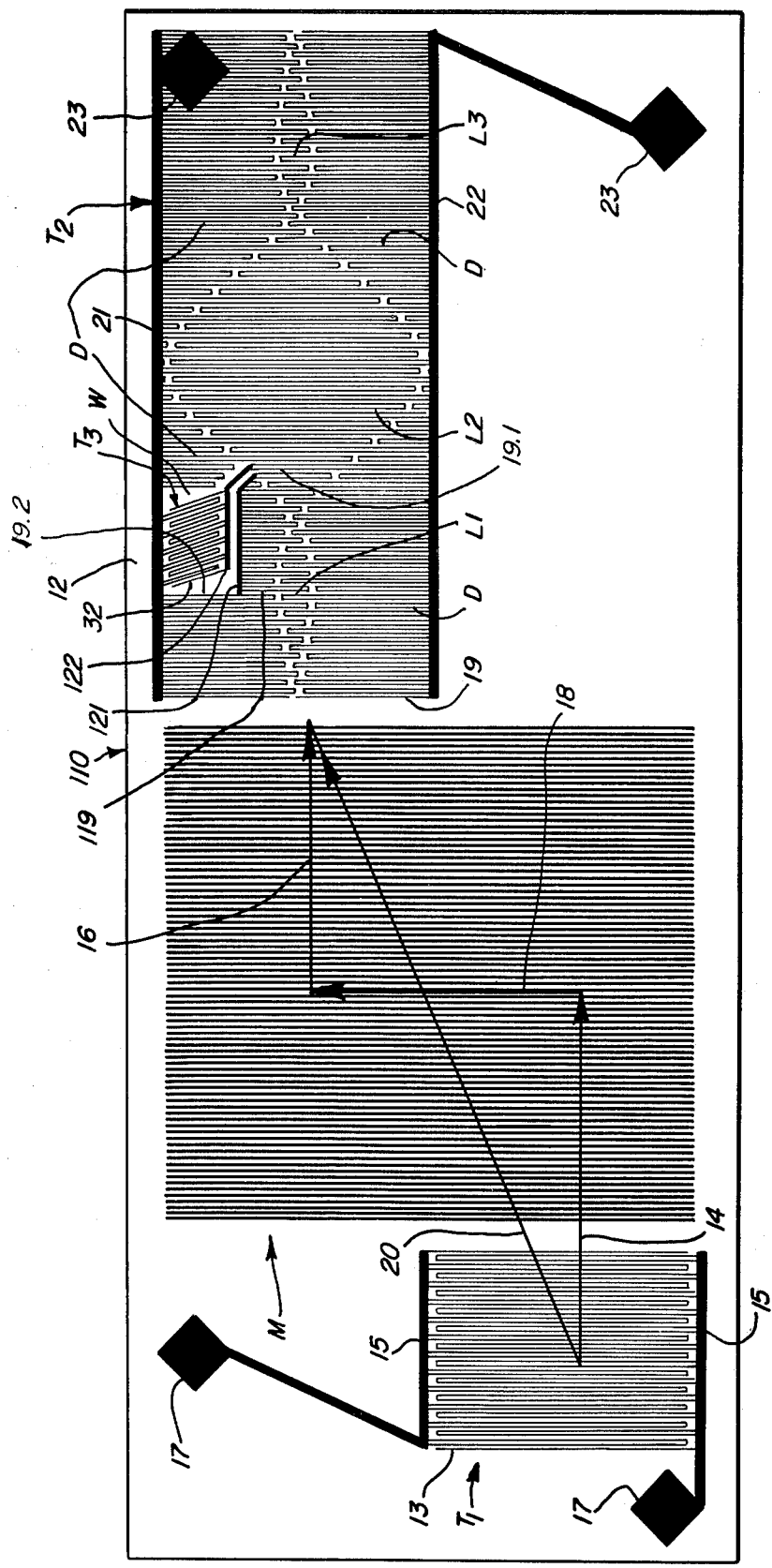
FIG. 2 is a similar view of an alternative embodiment of a surface acoustic wave filter in accordance with this invention.

FIG. 2 shows an alternative filter embodiment 110 which is identical in all respects to filter 10 of FIG. 1 except that a different arrangement of auxiliary bus bars is employed. In this embodiment the auxiliary bus bar 22' of FIG. 1 is replaced by an auxiliary bus bar 122 which does not extend across fingers 19 to the left of the auxiliary transducer T3, and does not require an external lead 24. Instead, auxiliary bus bar 122 is energized by connecting at its right hand end with finger 19.1 which in turn is energized by primary bus bar 22.

Similarly, auxiliary bus bar 21' of FIG. 1 is replaced in this embodiment by an auxiliary bus bar 121 which also does not extend across fingers 19 to the left of T3. Auxiliary bus bar 121 is energized by connecting at its left hand end with finger 19.2 which in turn is energized by primary bus bar 21. The auxiliary bus bar 121 extends far enough to the right to energize each of the fingers 19 which are cut off from primary bus bar 21 by auxiliary bus bar 122, i.e. all of those which are located between fingers 19.1 and 19.2

The fingers 32 of secondary transducer T3 are so located relative to the fingers 19 of primary transducer T2 that the respective electrical outputs which T3 and T2 deliver across terminals 23 are substantially 180° out of phase, thus permitting compensation of T2's spurious 47.25 MHz response by T3. The fingers 32 are substantially parallel to the local crests of the 47.25 MHz diffracted acoustic wave; in a particular embodiment in which the secondary transducer T3 was located as shown, the angle $\alpha$ necessary to achieve this condition was approximately 20°. The spacing of fingers 32 is chosen to coincide with the surface acoustic wavelength in the substrate material for the diffracted wave at the trap frequency of 47.25 MHz. The number and the interdigitated length of fingers 32 are chosen so that the output voltage of secondary transducer T3 is equal to that of primary transducer T2 at 47.25 MHz, although opposite in phase, so as to compensate for T2's trap frequency response.

It is also desirable to design the filter so that the signal induced in the auxiliary transducer T3 at passband frequencies by the desired (undiffracted) acoustic field is minimized; otherwise the desired response of the primary transducer T2 would be partly cancelled by T3. The calculation which achieves this objective is as follows. The magnitude of the electrical response induced in the auxiliary transducer T3 by the desired main, or undiffracted, acoustic field depends on the aperture of auxiliary transducer T3 and on the angle between the wavefronts of the main acoustic field and the slanted fingers 32 of T3. Since these wavefronts are parallel to the fingers 19 of the primary transducer T2, the latter angle is equal to $\alpha$. To a first approximation, the response induced in T3 by the main acoustic field is proportional to $$\frac{\sin\left(\frac{d}{\lambda}\pi\right)}{\frac{d}{\lambda}\pi}$$

where distance d is the axial displacement between opposite ends of slanted fingers 32, as indicated in FIG. 1, and $\lambda$ is the acoustic wavelength of the main field at the center frequency of the passband. Distance d is given by $d = a \tan \alpha$ where a is the aperture of transducer T3. If the filter design is such that $$d/\lambda = n$$

where n is any integer, then $$(d/\lambda)\pi = n\pi$$

and $$\sin\left(\frac{d}{\lambda}\pi\right) = \sin n\pi$$

In practice d is chosen equal to $\lambda$, so that $$n = (d/\lambda) = (\lambda/\lambda) = 1$$

and $$\sin n\pi = \sin \pi = 0$$

Therefore, the signal induced in the auxiliary transducer Tx by the main acoustic field, which is proportional to $$\frac{\sin\left(\frac{d}{\lambda}\pi\right)}{\frac{d}{\lambda}\pi}$$

is substantially equal to zero.

These calculations also serve to determine the aperture a of T3. Since $$(d/\lambda)\pi = n\pi$$

where n is an integer, it follows that $$(d/\lambda) = n$$

and since $d = a \tan \alpha$, then the aperture is given by $$a = (n\lambda)/\tan \alpha$$

An additional design requirement follows from the fact that in a TV IF filter the lower trap frequency of 39.75 MHz, unlike the upper trap frequency of 47.25 MHz, is not much affected by diffraction. (This is because the wavelength of the diffracted acoustic field at 39.75 MHz is quite different from the spacing between fingers 19 of the primary transducer T2.) Therefore the auxiliary transducer T3 should not be allowed to contribute any significant output at that frequency. In other words, we wish to limit the bandwidth of T3. The bandwidth of any interdigital transducer is inversely proportional to its number of finger pairs. The goal of minimizing T3's lower trap frequency response will be achieved if $$\frac{N_a(f_L - f_C)}{f_C} = i$$

where $N_a$ is the number of pairs of fingers 32 in the auxiliary transducer T3, $f_L$ is the lower trap frequency of the filter, $f_C$ is the center frequency of transducer T3, and i is any positive or negative (i.e. non-zero) integer.

From the foregoing analysis it is clear that these design objectives can sometimes conflict with each other, and therefore in some cases engineering compromises will have to be made in order to achieve the best overall result. This will now be illustrated in the following example, which involves the design of a surface acoustic wave device for use as a TV IF filter with a compensating signal of −40 dB at the upper trap frequency of 47.25 MHz. Experimentally it is found that, for the auxiliary transducer T3, the product of Na, the number of pairs of fingers 32, and the aperture a of transducer T3, when expressed in wavelengths λ of the diffracted surface acoustic wave at the upper trap frequency, should be about 30λ, or A $N_a=30$, in order to meet the −40 dB requirement. If α is 20°, the equation given above $$a = (n\lambda)/\tan \alpha$$

gives the result that a $=2.7\lambda$. Substituting this value of a $=2.7$ into the relation $aN_a=30$, it follows that $N_a$ is approximately equal to 11. If the integer i mentioned above is set equal to −2, then $$\frac{N_a (f_L - f_C)}{f_C} = i = -2$$

and substituting $N_a=11$ into this relation requires the center frequency $f_C$ of the auxiliary transducer T3 to be approximately equal to 48.6 MHz, for a lower trap frequency $f_L=39.75$ MHz. Consequently the peak response of T3 is at 48.6 MHZ, instead of precisely at the upper trap frequency of 47.25 MHz; but as a practical matter that is close enough.

If it were desirable to reduce the output of the auxiliary transducer T3 while still achieving essentially the same design objectives in all other respects, this can be done by increasing angle α while at the same time decreasing aperture a so as to maintain the relation $$a = (n\lambda)/\tan \alpha$$

This, however, may cause the angle α to deviate somewhat from a condition of parallelism with the diffraction field wavefronts, which represents another engineering compromise.

It will now be appreciated that the secondary receiving transducer, with its active fingers set at an angle that is calculated to cooperate with the diffracted wavefront, thereby provides a predictable trap frequency response which is equal in magnitude and opposite in phase to that of the primary receiving transducer, so that effective compensation is achieved at the trap frequency when the two receiving transducers are electrically connected in parallel.

The illustrated and described embodiment represents the preferred form of the invention, but alternative embodiments may be imagined which would come within the novel teachings herein. Accordingly, this embodiment is to be considered as merely illustrative, and not as limiting the scope of the following claims.

The invention claimed is:

1. A surface wave acoustic device adapted to be employed in an environment where it receives a surface acoustic signal including a desired frequency component having wave fronts substantially parallel to a selected direction and an undesired frequency component having wave fronts at a substantial angle to said selected direction, said device comprising:
   a primary array and a secondary array of finger pairs, each of said pairs having respective lengths interdigitated with each other whereby to function as respective elemental electro-acoustic transducers;
   said interdigitated lengths of said finger pairs of said primary array being oriented substantially parallel to said selected direction, and those of said secondary array being oriented substantially parallel to said wave fronts of said undesired frequency component;
   and an electrical circuit including means electrically connecting said primary and secondary arrays so that their instantaneous outputs add phasorially;
   said secondary array being positioned relative to said primary array so as to be substantially in electrical phase opposition thereto whereby the response of said secondary array to said undesired frequency component tends to compensate for the response of said primary array thereto.

2. A device as in claim 1 wherein said secondary array is so designed that its response at said undesired frequency is substantially equal in amplitude to that of said primary array at the same undesired frequency whereby to cancel said primary array response.

3. In a surface acoustic wave device of the type including a first acoustic path, sending transducer means positioned to emit a surface acoustic signal on said path and a diffracted surface acoustic wave at an angle to said path, a second acoustic path offset laterally from said first path, means coupling said paths to transfer said signal from said first path to said second path, and receiving transducer means positioned to receive said signal after it has been transferred to said second path and to receive said diffracted wave arriving directly from said sending transducer means; the improvement comprising:
   compensating transducer means positioned to receive said diffracted wave and including finger pairs having respective lengths interdigitated with each other whereby to function as respective elemental electro-acoustic transducers;
   said interdigitated lengths of said finger pairs being oriented substantially parallel to the wave fronts of said diffracted wave;
   and an electrical circuit including means electrically connecting said receiving and compensating transducer means so that their instantaneous outputs add phasorially;
   said compensating transducer means being positioned relative to said receiving transducer means so as to be substantially in electrical phase opposition thereto whereby the response of said compensating transducer means to said diffracted wave tends to compensate for the response of said receiving transducer means thereto.

4. A device as in claim 3 wherein:
said receiving transducer means comprises an apodized transducer defining an active area and an inactive area;
and said compensating transducer means is positioned in said inactive area.

5. A device as in claim 4 wherein said receiving transducer means comprises:
   interdigitated finger pairs;
   first and second primary bus bars electrically connected to first and second fingers respectively of each said pair;
   a window region within said inactive area in which interdigitated lengths of said first fingers are disconnected from said first primary bus bar;
   means including a first auxiliary bus bar electrically connecting said disconnected interdigitated lengths of said first fingers of said receiving transducer means to said first primary bus bar;

said compensating transducer means being located within said window region;

a first finger of each said finger pair of said compensating transducer means being electrically connected to said first primary bus bar;

and means including a second auxiliary bus bar electrically connecting a second finger of each said finger pair of said compensating transducer means to said second primary bus bar.

6. An apodized surface acoustic wave transducer having a plurality of pairs of fingers and defining an active area within which the fingers of each said pair are interdigitated and an inactive area within which they are not interdigitated;

first and second primary bus bars electrically connected to first and second fingers respectively of each said pair;

a window region within said inactive area in which said interdigitated lengths of said first fingers are disconnected from said first primary bus bar;

means including a first auxiliary bus bar electrically connecting said disconnected interdigitated lengths of said first fingers of said receiving transducer means to said first primary bus bar;

compensating transducer means located within said window region;

said compensating transducer means having interdigitated finger pairs;

a first finger of each said finger pair of said compensating transducer means being electrically connected to said first primary bus bar;

and means including second auxiliary bus bar electrically connecting a second finger of each said finger pair of said compensating transducer means to said second primary bus bar.

7. A device as in claim 6 wherein said compensating transducer means occupies only a part of said window region, and the remainder of said window region is substantially occupied by inactive finger lengths.

8. A device as in claim 6 wherein said second auxiliary bus bar is interposed between said compensating transducer means and said first auxiliary bus bar.

9. A device as in claim 6 further comprising electrical lead means external to said apodized transducer connecting said second auxiliary bus bar to said second primary bus bar.

10. A surface acoustic wave filter having a passband and trap frequencies above and below said passband respectively;

said filter bedng adapted to be employed in an environment where it receives a surface acoustic signal including a desired frequency component within said passband, said desired frequency component having wave fronts substantially parallel to a selected direction, and respective undesired frequency components at said trap frequencies, at least one of said undesired frequency components having wave fronts at a substantial angle to said selected direction;

said filter comprising;

a primary array and a secondary array of finger pairs, each of said pairs having respective lengths interdigitated with each other whereby to function as respective elemental electro-acoustic transducers;

said interdigitated lengths of said finger pairs of said primary array being oriented substantially parallel to said selected direction, and those of said secondary array being oriented substantially parallel to said wave fronts of said one undesired frequency component;

and an electrical circuit including means electrically connecting said primary and secondary arrays so that their instantaneous outputs add phasorially;

said secondary array being positioned relative to said primary array so as to be substantially in electrical phase opposition thereto whereby the response of said secondary array to said one undesired frequency component tends to compensate for the response of said primary array thereto;

said primary array being substantially more responsive to said one undesired frequency component than to the other of said undesired frequency components;

said secondary array being so arranged as to minimize its response to said other undesired frequency component, at which compensation is unnecessary and undesirable.

11. A surface acoustic wave filter having a passband and trap frequencies above and below said passband respectively;

said filter being adapted to be employed in an environment where it receives a surface acoustic signal including a desired frequency component within said passband, said desired frequency component having wave fronts substantially parallel to a selected direction, and respective undesired frequency components at said trap frequencies, at least one of said undesired frequency components having wave fronts at a substantial angle to said selected direction;

said filter comprising:

a primary array and a secondary array of finger pairs, each of said pairs having respective lengths interdigitated with each other whereby to function as respective elemental electro-acoustic transducers;

said interdigitated lengths of said finger pairs of said primary array being oriented substantially parallel to said selected direction, and those of said secondary array being oriented substantially parallel to said wave fronts of said one undesired frequency component;

and an electrical circuit including means electrically connecting said primary and secondary arrays so that their instantaneous outputs add phasorially;

said secondary array being positioned relative to said primary array so as to be substantially in electrical phase opposition thereto whereby the response of said secondary array to said one undesired frequency component tends to compensate for the response of said primary array thereto;

said secondary array being so arranged as to minimize its response to said desired frequency component.

12. A filter as in claim 11 wherein the displacement, perpendicular to said selected direction, of the opposite ends of each finger of said secondary array relative to each other, is substantially equal to the surface acoustic wavelength of said desired frequency component in said filter.

* * * * *